US006344812B1

United States Patent
Takeda et al.

(10) Patent No.: US 6,344,812 B1
(45) Date of Patent: Feb. 5, 2002

(54) DELTA SIGMA DIGITAL-TO-ANALOG CONVERTER

(75) Inventors: Minoru Takeda, Omiya; Yoshihiro Hanada, Yokohama, both of (JP)

(73) Assignee: Nippon Precision Circuits, Inc., Tokyo (JP)

( * ) Notice: Subject to any disclaimer, the term of this patent is extended or adjusted under 35 U.S.C. 154(b) by 16 days.

(21) Appl. No.: 09/587,870

(22) Filed: Jun. 6, 2000

(30) Foreign Application Priority Data

Jun. 7, 1999  (JP) .......................................... 159852-99

(51) Int. Cl.[7] .................................................. H03M 3/00
(52) U.S. Cl. ........................................ 341/143; 341/144
(58) Field of Search .................................. 341/143, 144, 341/77, 145, 152

(56) References Cited

U.S. PATENT DOCUMENTS 5,495,504 A  *  2/1996  Yasuda .......................... 375/281
6,204,788 B1 *  3/2001  Tani ............................. 341/144

OTHER PUBLICATIONS

Yukawa, Akira "An Oversampling A–D/D–A Conversion Technique", Nikkei Electronics, Aug. 8, 1988, pp. 211–221 (published in Japan). (with translation).

* cited by examiner

Primary Examiner—Tuan T. Lam
(74) Attorney, Agent, or Firm—Joel E. Luzker; Donna Angotti; Schulte Roth & Zabel (57) ABSTRACT

An improved delta sigma digital-to-analog converter in which the thermometer code, which is output from a thermometer code converter, is divided into P blocks for every Q bits. An arrangement of the blocks is shifted in rotation by a barrel shifter at a frequency fs. Along with this, an arrangement of bits within each block is shifted in rotation by a shift register at a frequency of Q times fs. The bits within the code thus obtained are provided to local DACs, each specified to correspond to each of the given bits. In this manner, it is possible to maintain a lower operating frequency while at the same time to reducing the distortion in the output caused by a change in shifting the data in rotation in the local DACs, which change occurs depending on bit levels of the data in a form of the thermometer code.

2 Claims, 9 Drawing Sheets

| Sampling Period n | 0 | 1 | 2 | 3 | 4 | 5 | 6 | 7 | 8 | 9 | 10 | Example of LDAC Error Unit "e" | LDAC Output |
|---|---|---|---|---|---|---|---|---|---|---|---|---|---|
| Sampled Value x(n*Ts) Level | 1 | 1 | 1 | 6 | 6 | 6 | 11 | 11 | 3 | 7 | 10 | | |
| LDAC1 | 1 | | | | | | | | | | | −5.5 | 1−5.5e |
| LDAC2 | | 1 | | | | | | | | | | −4.5 | 1−4.5e |
| LDAC3 | | | 1 | | | | | | | | | −3.5 | 1−3.5e |
| LDAC4 | | | | 1 | 1 | | | | | | | −2.5 | 1−2.5e |
| LDAC5 | | | | 1 | 1 | 1 | 1 | 1 | | | | −1.5 | 1−1.5e |
| LDAC6 | | | | 1 | 1 | 1 | 1 | 1 | | | | −0.5 | 1−0.5e |
| LDAC7 | | | | 1 | 1 | 1 | 1 | 1 | | | | 0.5 | 1+0.5e |
| LDAC8 | | | | 1 | 1 | 1 | 1 | 1 | 1 | | | 1.5 | 1+1.5e |
| LDAC9 | | | | | 1 | 1 | 1 | 1 | 1 | | | 2.5 | 1+2.5e |
| LDAC10 | | | | | | | 1 | 1 | 1 | 1 | 1 | 3.5 | 1+3.5e |
| LDAC11 | | | | | | | | | | 1 | 1 | 4.5 | 1+4.5e |
| LDAC12 | | | | | | | | | | | 1 | 5.5 | 1+5.5e |
| Signal Integral Value in Period Ts | 1 | 1 | 1 | 6 | 6 | 6 | 11 | 11 | 3 | 7 | 10 | | |
| Averaged Error Value in Period Ts | −5.5 | −4.5 | −3.5 | 0 | 0 | 0 | −2.5 | −1.5 | 7.5 | −7.5 | 4 | | |
| Cumulative Average of Error Value | −5.50 | −5.00 | −4.50 | −3.38 | −2.70 | −2.25 | −2.29 | −2.19 | −1.11 | −1.75 | −1.23 | | |

Level after Integration

| Sampling Period n | 0 | 1 | 2 | 3 | 4 | 5 | 6 | 7 | 8 | 9 | 10 |
|---|---|---|---|---|---|---|---|---|---|---|---|
| Signal Integral Value in Period Ts | 1 | 1 | 1 | 6 | 6 | 6 | 11 | 11 | 3 | 7 | 10 |

| | | Unit | 0 | | | | 1 | | | | 2 | | | | 3 | | | |
|---|---|---|---|---|---|---|---|---|---|---|---|---|---|---|---|---|---|---|
| Sampling Period | n | Ts | 0 | | | | 1 | | | | 2 | | | | 3 | | | |
| Clock | m | Ts/4 | 1 | 2 | 3 | 4 | 1 | 2 | 3 | 4 | 1 | 2 | 3 | 4 | 1 | 2 | 3 | 4 |
| Sampled Value | d(n*Ts) | Level | 1 | | | | 1 | | | | 1 | | | | 6 | | | |
| Start Block | Q | | 1 | | | | 2 | | | | 3 | | | | 1 | | | |
| DAC Name | DAC Block P=1 | 1 LDAC1 | 1 | | | | | | | | | | | | 1 | | | |
| | | 2 LDAC2 | | 1 | | | | | | | | | | | 1 | 1 | | |
| | | 3 LDAC3 | | | 1 | | | | | | | | | | 1 | 1 | 1 | |
| | | 4 LDAC4 | | | | 1 | | | | | | | | | 1 | 1 | 1 | 1 |
| | DAC Block P=2 | 1 LDAC5 | | | | | 1 | | | | | | | | 1 | 1 | 1 | 1 |
| | | 2 LDAC6 | | | | | | 1 | | | | | | | 1 | 1 | 1 | 1 |
| | | 3 LDAC7 | | | | | | | 1 | | | | | | | 1 | 1 | 1 |
| | | 4 LDAC8 | | | | | | | | 1 | | | | | | | 1 | 1 |
| | DAC Block P=3 | 1 LDAC9 | | | | | | | | | 1 | | | | | | | 1 |
| | | 2 LDAC10 | | | | | | | | | | 1 | | | | | | |
| | | 3 LDAC11 | | | | | | | | | | | 1 | | | | | |
| | | 4 LDAC12 | | | | | | | | | | | | 1 | | | | |
| Signal Integral Value in Period Ts | | | 1 | 1 | 1 | 1 | 1 | 1 | 1 | 1 | 1 | 1 | 1 | 1 | 6 | 6 | 6 | 6 |
| Signal Integral Value in Period Ts/4 | | | 1 | | | | 1 | | | | 1 | | | | 6 | | | |
| Error Integral Value in Clock Period | | | -5.5 | -4.5 | -3.5 | -2.5 | -1.5 | -0.5 | 0.5 | 1.5 | 2.5 | 3.5 | 4.5 | 5.5 | -18 | -12 | -6 | 0 |
| Averaged Error Value in Period Ts | | | -4 | | | | 0 | | | | 4 | | | | -9 | | | |
| Cumulative Average of Error Value | | | -4.00 | | | | -2.00 | | | | 0.00 | | | | -2.25 | | | |

| Level after Integration | 12 | | | | | | | | | | | | | | | | | |
|---|---|---|---|---|---|---|---|---|---|---|---|---|---|---|---|---|---|---|
| | 11 | | | | | | | | | | | | | | | | | |
| | 10 | | | | | | | | | | | | | | | | | |
| | 9 | | | | | | | | | | | | | | | | | |
| | 8 | | | | | | | | | | | | | | | | | |
| | 7 | | | | | | | | | | | | | | | | | |
| | 6 | | | | | | | | | | | | | 1 | 1 | 1 | 1 |
| | 5 | | | | | | | | | | | | | 1 | 1 | 1 | 1 |
| | 4 | | | | | | | | | | | | | 1 | 1 | 1 | 1 |
| | 3 | | | | | | | | | | | | | 1 | 1 | 1 | 1 |
| | 2 | | | | | | | | | | | | | 1 | 1 | 1 | 1 |
| | 1 | 1 | 1 | 1 | 1 | 1 | 1 | 1 | 1 | 1 | 1 | 1 | 1 | 1 | 1 | 1 | 1 |
| Signal Integral Value in Clock Period | | 1 | 1 | 1 | 1 | 1 | 1 | 1 | 1 | 1 | 1 | 1 | 1 | 6 | 6 | 6 | 6 |
| Quarter of Signal Integral Value in Periods Ts | | 1 | | | | 1 | | | | 1 | | | | 6 | | | |
| Time | n | Ts | 0 | | | | 1 | | | | 2 | | | | 3 | | | |

Fig.6

| | | Unit | | | | | | | | | | | | | | | | | |
|---|---|---|---|---|---|---|---|---|---|---|---|---|---|---|---|---|---|---|---|
| Sampling Period | n | Ts | 4 | | | | 5 | | | | 6 | | | | 7 | | | | |
| Clock | m | Ts/4 | 1 | 2 | 3 | 4 | 1 | 2 | 3 | 4 | 1 | 2 | 3 | 4 | 1 | 2 | 3 | 4 | |
| Sampled Value | d(n*Ts) | Level | 6 | | | | 6 | | | | 11 | | | | 11 | | | | Example of LDAC Error | LDAC Output |
| | Start Block | Q | 2 | | | | 3 | | | | 1 | | | | 2 | | | | Unit "e" | |
| DAC Name | DAC Block P=1 | 1 LDAC1 | | | | 1 | 1 | 1 | 1 | 1 | 1 | | 1 | 1 | 1 | 1 | 1 | 1 | -5.5 | 1-5.5e |
| | | 2 LDAC2 | | | | | 1 | 1 | 1 | 1 | 1 | 1 | | 1 | 1 | 1 | 1 | 1 | -4.5 | 1-4.5e |
| | | 3 LDAC3 | | | | | | 1 | 1 | 1 | 1 | 1 | 1 | | 1 | 1 | 1 | 1 | -3.5 | 1-3.5e |
| | | 4 LDAC4 | | | | | | | 1 | 1 | 1 | 1 | 1 | 1 | | 1 | 1 | 1 | -2.5 | 1-2.5e |
| | DAC Block P=2 | 1 LDAC5 | 1 | | | | | | | 1 | 1 | 1 | 1 | 1 | 1 | | 1 | 1 | -1.5 | 1-1.5e |
| | | 2 LDAC6 | 1 | 1 | | | | | | | 1 | 1 | 1 | 1 | 1 | 1 | | 1 | -0.5 | 1-0.5e |
| | | 3 LDAC7 | 1 | 1 | 1 | | | | | | | 1 | 1 | 1 | 1 | 1 | 1 | | 0.5 | 1-0.5e |
| | | 4 LDAC8 | 1 | 1 | 1 | 1 | | | | | | | 1 | 1 | 1 | 1 | 1 | 1 | 1.5 | 1+1.5e |
| | DAC Block P=3 | 1 LDAC9 | 1 | 1 | 1 | 1 | 1 | | | | | | | 1 | 1 | 1 | 1 | 1 | 2.5 | 1+2.5e |
| | | 2 LDAC10 | 1 | 1 | 1 | 1 | 1 | 1 | | | | | | | 1 | 1 | 1 | 1 | 3.5 | 1+3.5e |
| | | 3 LDAC11 | | 1 | 1 | 1 | 1 | 1 | 1 | | | | | | | 1 | 1 | 1 | 4.5 | 1+4.5e |
| | | 4 LDAC12 | | | 1 | 1 | 1 | 1 | 1 | 1 | | | | | | | 1 | 1 | 5.5 | 1+5.5e |
| Signal Integral Value in Period Ts | | | 6 | 6 | 6 | 6 | 6 | 6 | 6 | 6 | 11 | 11 | 11 | 11 | 11 | 11 | 11 | 11 | | |
| Signal Integral Value in Period Ts/4 | | | 6 | | | | 6 | | | | 11 | | | | 11 | | | | | |
| Error Integral Value in Clock Period | | | 6 | 12 | 18 | 12 | 6 | 0 | -6 | -12 | -6 | 5.5 | 4.5 | 3.5 | 2.5 | 1.5 | 0.5 | -1 | | |
| Averaged Error Value in Period Ts | | | 12 | | | | -3 | | | | 2 | | | | 1 | | | | | |
| Cumulative Average of Error Value | | | 0.80 | | | | 0.00 | | | | 0.29 | | | | 0.36 | | | | | |

DELTA SIGMA DIGITAL-TO-ANALOG CONVERTER

BACKGROUND OF THE INVENTION

1. Field of the Invention

The present invention relates to a delta sigma (modulation) digital-to-analog converter (DAC) for digital audio equipment having a low distortion factor and a high S/N (signal to noise) ratio, and more particularly to a delta sigma digital-to-analog converter having a quantizer connected to a local digital-to-analog converter and having three or more quantizing levels.

2. Description of the Related Art

The delta sigma (modulation) DAC is widely used in audio equipment. The performance of a digital-to-analog converter in audio equipment is principally represented by factors such as a distortion factor (a ratio of a harmonic component to a signal) and a signal to noise (SIN) ratio. The performance of digital-to-analog converters in related art largely depends on absolute and relative variations in characteristics of components such as resistors and capacitors rather than circuit types, which variations are difficult to reduce in newer more precise components. Compared with this, in the delta sigma converter for which quantizing levels ranging only from two (1 bit) to several are required, the variations among components do not become a problem as in the related art converter. In recent years, however, higher performance has been required for digital-to-analog converters used in audio equipment so as to comply with the new 24 bit format of Digital Video Disc (DVD), as opposed to prior 16 bit format of Compact Disc (CD).

In order to improve the distortion factor and the S/N ratio, it is theoretically possible to increase any of the following: (1) the order of the delta sigma modulator; (2) the sampling frequency; or (3) the number of quantized levels (i.e., the number of bits) (See, e.g., "An oversampling A-D/D-A conversion technique (2)", Nikkei Electronics Aug. 8, 1988, No. 453, pp. 211–221).

Figure 1:
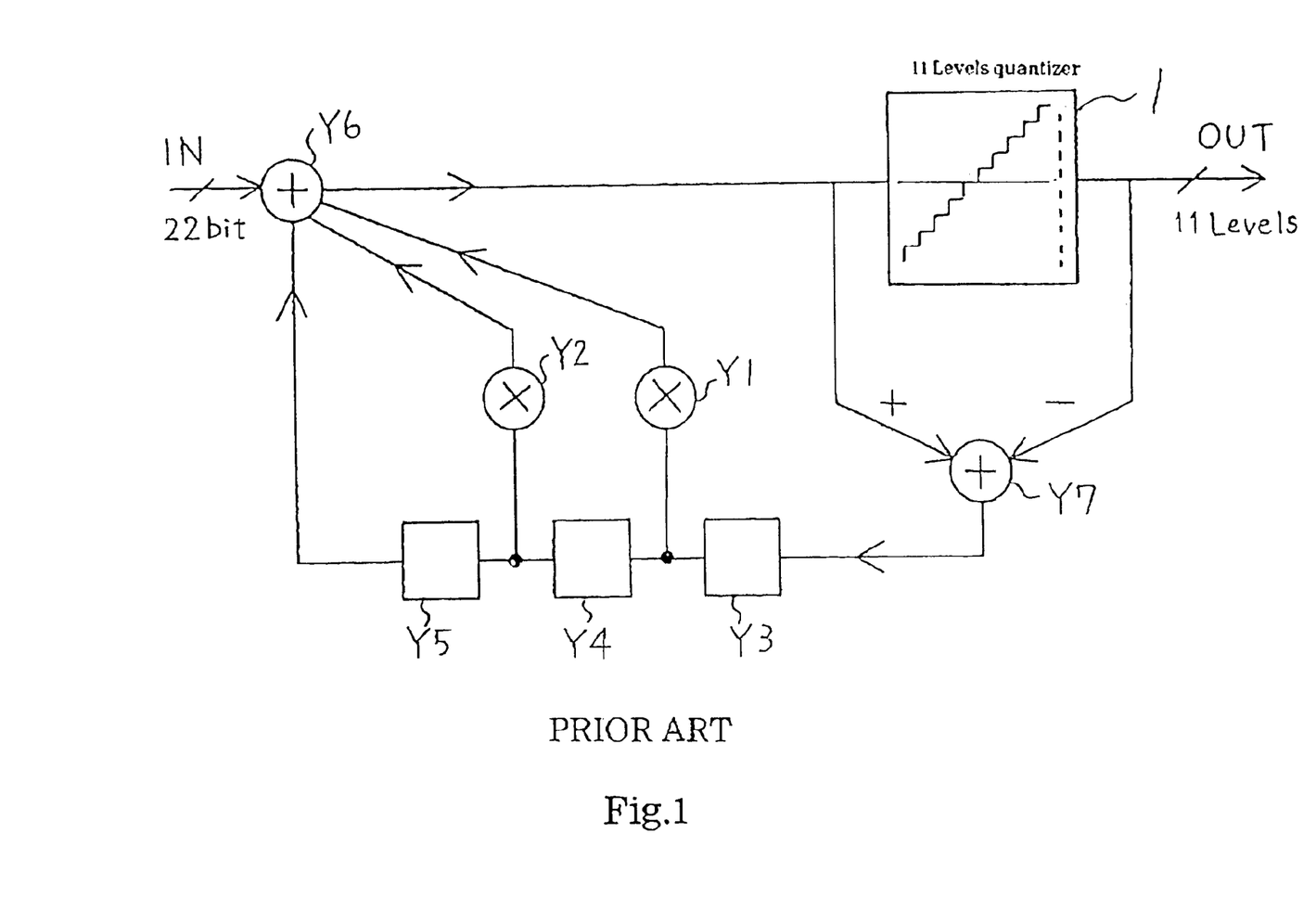
FIG. 1 is a block diagram illustrating an example of a configuration of a thirdorder noise shaper arithmetic unit as a principal part of a delta sigma digital-to-analog converter in the prior art.

An excessive increase in the order of the delta sigma modulator, however, is unsuitable for maintaining the stability of the feedback system called the "noise shaper." A noise shaper arithmetic unit is a one which converts a multi-bit digital signal, input by oversampling, to a digital signal with lower bits than those of the multi-bit digital signal by noise shaper operation and outputs it from a quantizer. Referring to FIG. 1, a third-order noise shaper arithmetic unit is shown which comprises multipliers Y1 and Y2, delay circuits Y3, Y4 and Y5, and adders Y6 and Y7. The delay circuits Y3, Y4 and Y5, which each provide a delay by one sampling period, are connected in series in numerical order. At adder Y6, an output from the delay circuit Y5 and outputs from the multipliers Y1 and Y2 are added to the input multi-bit digital signal (e.g., a 22 bit digital signal). At the multipliers Y1 and Y2, outputs from the delay circuits Y3 and Y4 are multiplied by coefficients 3 and –3, respectively. The result of the addition output from adder Y6 is input to quantizer 1. The output of quantizer 1 is branched and subtracted from the input thereto at adder Y7 to be an input to delay circuit Y3. In FIG. 1, an arithmetic unit is shown in which a 22 bit digital signal is input for conversion to a 4 bit digital signal with 11 levels.

With respect to increasing the sampling frequency, i.e., increasing the operating frequency of the noise shaper arithmetic unit, this requires that the frequency of the system clock in the associated audio equipment be increased. This results in an increase in the cost of the audio equipment and in its power consumption, and also may cause interference noise in the analog audio system. As a result, the benefits of an increase in sampling frequency is limited to a certain extent.

In view of the foregoing, the best way to provide a delta sigma digital-to-analog converter with a reduced distortion factor and an improved S/N ratio is to adequately set the order of the delta sigma modulator and the sampling frequency therefor to increase the number of quantized levels. In order to adequately set the order of the delta sigma modulator and the sampling frequency therefor for increasing the number of quantized levels, a local digital-to-analog converter may be added which carries out a digital-to-analog conversion of the output of the built-in quantizer.

The resolution of the local digital-to-analog converter in the delta sigma modulation system is a minimum of 2 levels and at most several tens levels. Conventionally, Pulse Width Modulation (PWM) digital-to-analog converters or Dynamic Element Matching (DEM) digital-to-analog converters have been used in systems having three or more levels.

The PWM converter offers the advantage of higher precision because a plurality of levels are presented in a sampling period by using a clock frequency several times the sampling frequency, which clock frequency is provided by a highly precise quartz oscillator which determines the precision of conversion. However, the need to use an expensive high precision clock in PWM operation is a disadvantage of the PWM converter.

As for the DEM converter, a digital-to-analog converter is used with a plurality of converting elements for carrying out respective conversions at the same time. In this case, the DEM converter provides a delta sigma modulation in which the sampling frequency is set comparably high.

The DEM converter is provided with a plurality of analog elements such as resistors and capacitors, so that, when the elements are provided are included in an integrated circuit, the precision of the DEM converter depends on relative variations among elements which occur in the semiconductor production process for the integrated circuit. In order to reduce the influence of these variations on the precision of the converter, the DEM converter is operated so that all of the elements are configured so that they are equally used within a certain period of time according to a specified procedure. This method allows realization of better conversion precision than would result when simply relying upon the precision of the elements caused by the relative variations in the semiconductor production process.

Figure 2:
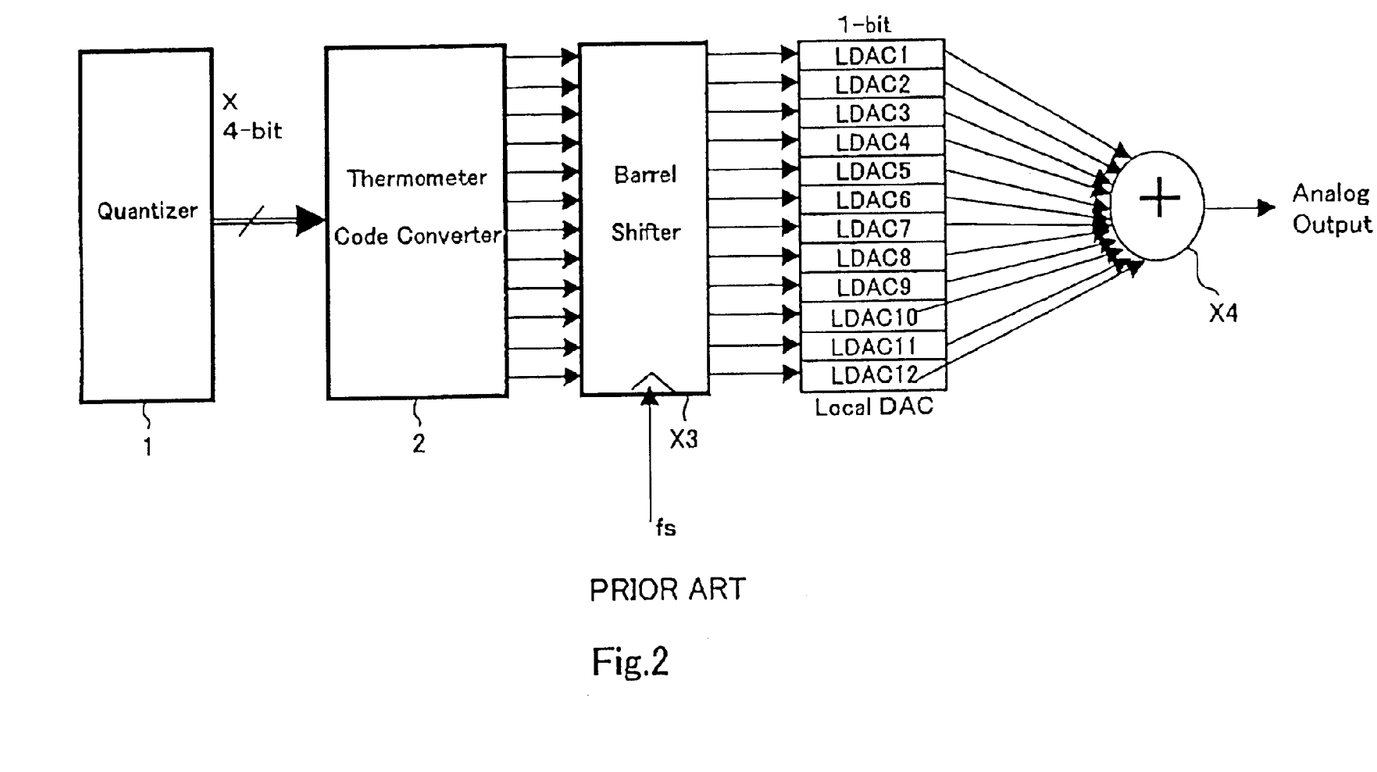
FIG. 2 is a diagram illustrating an example of a configuration of a delta sigma digital-to-analog converter in the prior art.

A specific example of a prior art delta sigma digital-to-analog converter is shown in FIG. 2. Hereinafter, the multi-level digital-to-analog converter is referred as the multi-level DAC. In FIG. 2, the highest level of the multi-level DAC is shown as level 11 for ease of the explanation. In addition, twelve 1 bit local DACs are provided (LDAC1 to LDAC12). For ease of explanation, hereinafter the local DACs LDAC1 to IDAC12 are referred to as simply IDAC1 to LDAC12. In operation, there will be no case in which all of the IDAC1 to LDAC12 are turned on, that is, unit amounts are given to all of them. The digital-to-analog converter shown in FIG. 2 comprises a thermometer code converter 2 which outputs a thermometer code corresponding to the number of output levels from quantizer 1 (which is shown in detail in FIG. 1), a barrel shifter X3 which shifts in rotation a bit arrangement of the thermometer code very sampling period, IDAC1 to LDAC12 which are equally weighted to each other (i.e., provided with resistors with resistance values equal to each other), and an analog adder X4. The thermometer code converter 2 produces a thermometer code with the number of bits corresponding to the number of the output levels from quantizer 1. Along with this, barrel shifter X3 shifts in rotation the bit arrangement of the thermometer code to selectively supply currents (unit amounts) to the LDAC1 to LDAC12. The unit amount supplied to each of the local DAC's is added to others to generate an analog output corresponding to the output levels of quantizer 1.

Figure 3:
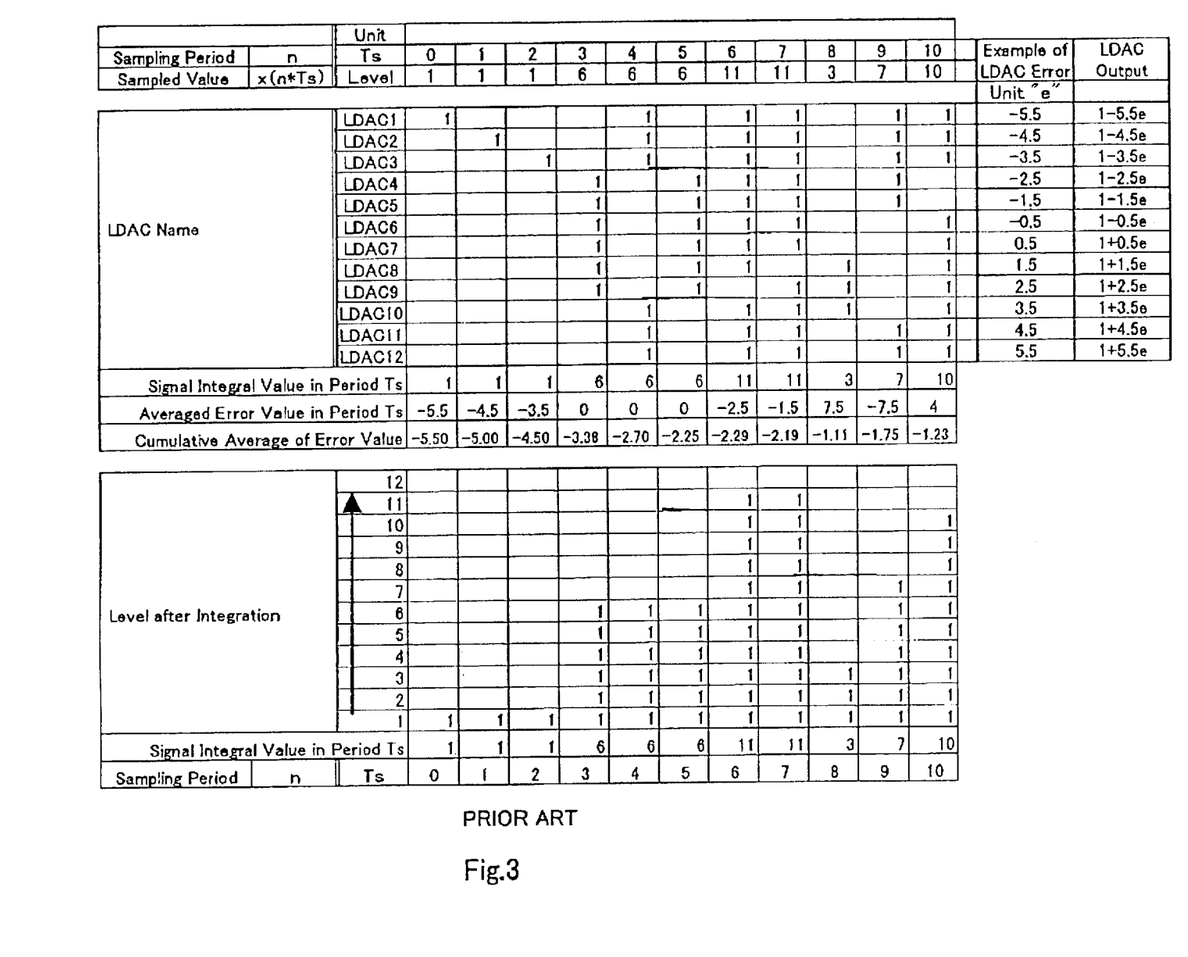
FIG. 3 is a diagram illustrating the operation of the delta sigma digital-to-analog converter shown in FIG. 2.

However, a conventional DEM converter shifts the thermometer code every sampling frequency period to supply in order the unit amount equally to the N local DACs and therefore has the following problem. The mode of rotation of the unit amount in the local DACs changes depending on the output data of quantizer 1 converted in a form of the thermometer code to cause distortion depending on the input data, as a result of which the converter is unsuitable for a DEM converter having multi-levels such as the eleven levels shown in FIG. 2. This is shown in the chart of FIG. 3, which presents the states at every period Ts for the sampling frequency fs about the unit amounts supplied to the LDAC1 to LDAC12, an integral value of errors in the local DACs, an integral value of the unit amounts in the LDAC1 to LDAC12, an averaged value of errors in the local DACs about the period, a cumulative average of errors in the local DACs, and an output level of the analog adder X4. As shown in FIG. 3, the thermometer code of 1 level is input to only one local DAC in one sampling period Ts. Therefore, as is apparent from FIG. 3, for a quantized output X lasting with level 1, it takes several cycles of Ts until all of the LDAC1 to LDAC12 are used. While, for a quantized output X with the higher number of levels almost all of the local DACs are used in 1 cycle of Ts. That is, the DEM converter has the disadvantage in that averaging of variations in local DACs tends to depend on signal values. In this regard, a simulation is carried out for the case where LDAC1 to LDAC12 have errors shown in the right upper column in FIG. 3. The result of the simulation shows that influence of the error for a signal in lower level is likely to remain.

There is a DEM converter in which, although no detailed configuration thereof is explained here, the unit amounts corresponding to a code are given to all of N local DACs in order in a sampling period Ts so that every local DAC is equally used. Such DEM converter, however, has the following problem.

Figure 4:
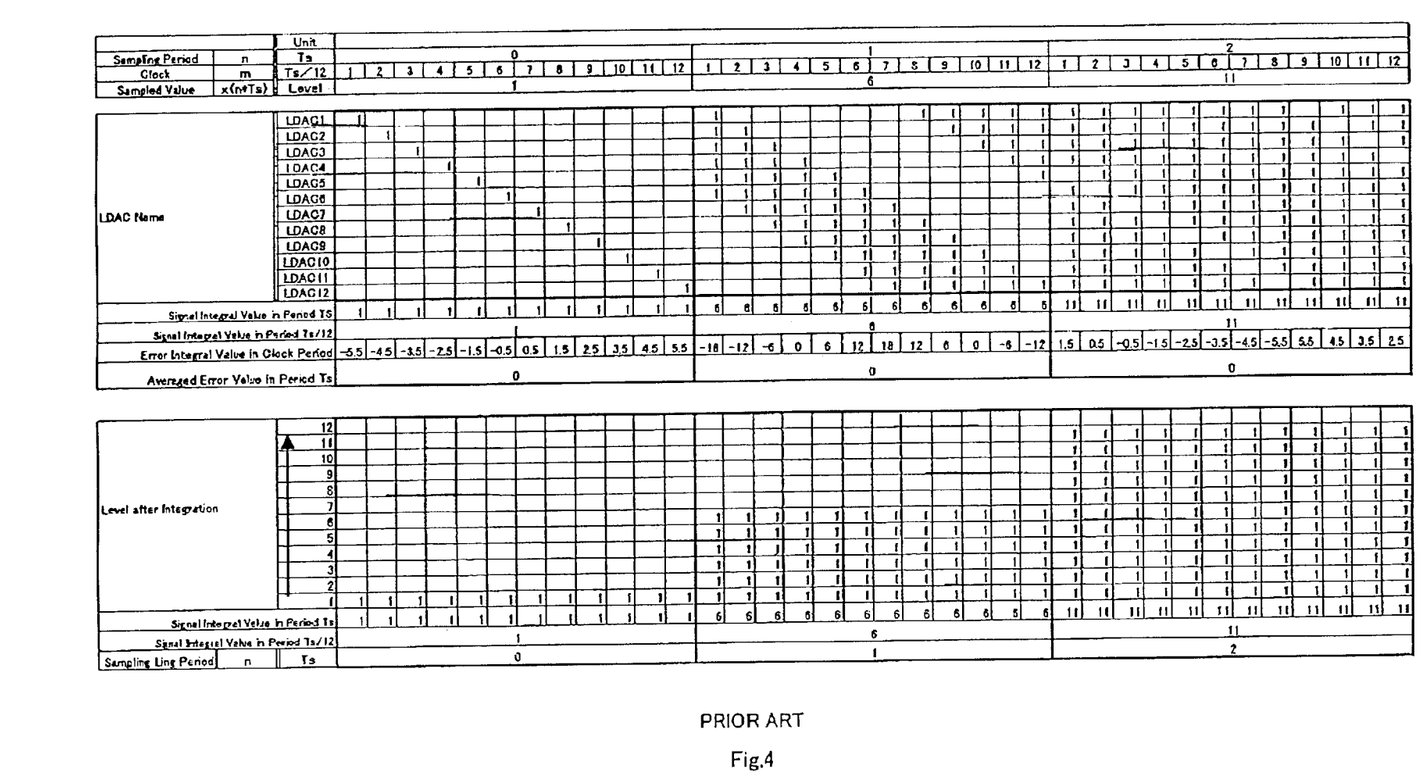
FIG. 4 is a diagram illustrating the operation of the delta sigma digital-to-analog converter shown in FIG. 2 using a higher than normal clock frequency.

For quantized levels of N and a noise shaper frequency of fs, at least a frequency of as high as (N*fs) is necessary for the system clock which requires that the audio system provide an expensive system clock. FIG. 4 is a diagram showing a result of simulation carried out in the case where a higher system clock frequency is used under the same error conditions as those in the case shown in FIG. 3. In FIG. 4, the case is shown where a sampling period Ts is finely divided by twelve. In a period of (Ts/12), one level is given to one of LDAC1 to LDAC12 in rotation. This allows all of the local DACs to be equally used even for an output of the quantizer being in one level, so that the output of the converter is fully averaged in a sampling period Ts. In this case, however, a clock with a frequency as high as 12*fs in necessary which increases the cost of the system.

SUMMARY OF THE INVENTION

In view of the foregoing, in the present invention, a bit arrangement of the thermometer code is divided into P blocks each being taken as one block for every Q bits, the bit arrangement is shifted in unit of the block in rotation at the sampling frequency fs, the bit arrangement is further shifted in unit of the bit in rotation at a frequency fs*Q and a code output of the shifted code is produced, each of bits of which output is given to the local DAC corresponding to each of the bits. Alternatively, the bit arrangement of the code output, which arrangement is taken as being expressed in terms of a matrix having P rows and Q columns where P represents an arrangement of the blocks and Q represents an arrangement in the block, is converted to a code output expressed in terms of a matrix having Q rows and P columns by interchanging the rows and columns with each other, by which a scattering in space is provided for the local DACs supplied with unit amounts. By means of any one or combination of the two, it is allowed to keep an operating frequency lower and to reduce distortion in the output which is due to change in shifting the data in rotation in the local DACs, which change occurs depending on bit levels of the data in a form of the thermometer code. That is, the present invention solves the problems that arise in conventional DEM converters to allow the realization of a digital-to-analog converter in which improved converting performance is provided without increasing costs.

Thus, the delta sigma digital-to-analog converter is constituted to comprise a set of N one bit local digital to analog converters equally weighted to each other, where N is equal to P times Q and where P and Q are each predetermined integers having a value of at least two; a quantizer having a digital input and an output having P times Q minus one quantized levels at a predetermined sampling frequency fs; a first converter having an input connected to the output of the quantizer for converting the quantizer output to a thermometer code comprising P times Q bits, which thermometer code is provided as an output of the first converter; and a second converter connected to the output of the first converter for receiving the thermometer code, dividing a bit arrangement of the thermometer code into P blocks, each being taken as one block for every Q bits, shifting the bit arrangement in unit of the block in rotation at the sampling frequency fs, further shifting the bit arrangement in unit of the bit in rotation at a frequency fs times Q, and thereby producing a output code on an output of the second converter, which output is, in turn, connected to the local digital to analog converters in corresponding order.

In addition, the delta sigma digital-to-analog converter is also constituted as to comprise a set of N one bit local digital to analog converters equally weighted to each other, where N is equal to P times Q and where P and Q are each predetermined integers having a value of at least two; a quantizer having a digital input and an output having P times Q minus one quantized levels at a predetermined sampling frequency fs; a first converter having an input connected to the output of the quantizer for converting the quantizer output to a thermometer code comprising P times Q bits, which thermometer code is provided on an output of the first converter; and a second converter receiving the thermometer code, dividing a bit arrangement of aid thermometer code into P blocks each being taken as one block for every Q bits, converting the bit arrangement of the temperature code, which arrangement is a matrix having P rows and Q columns where P represents the number of the blocks and Q represents the number of bits in each block, to a code output expressed in terms of a matrix having Q rows and P columns by interchanging the rows and columns, and supplying the code output, expressed in terms of a matrix having Q rows and P columns, as an output of the second converter, which output is connected to the local digital to analog converters in corresponding order.

DETAILED DESCRIPTION OF THE PREFERRED EMBODIMENTS

Figure 5:
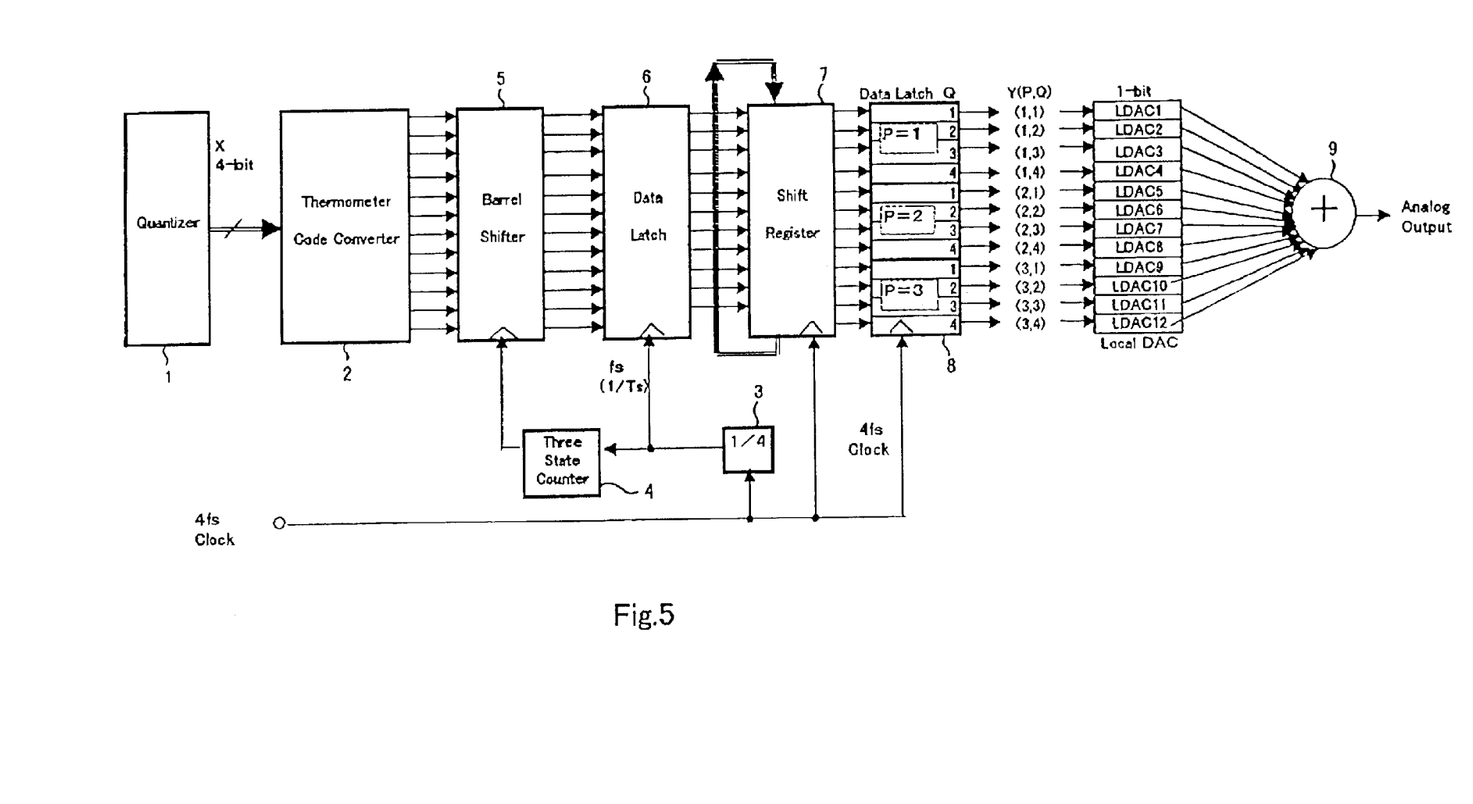
FIG. 5 is a diagram illustrating a configuration of the first embodiment of the delta sigma digital-to-analog converter according to the present invention.

The preferred embodiments of the present invention will be described with reference to the drawings. The delta sigma digital-to-analog converter according to the present invention will be explained in detail with respect to the first embodiment shown in FIG. 5. In FIG. 5, the same reference numerals as those used in FIGS. 1 and 2 designate the same elements, see e.g., quantizer 1 and thermometer code converter 2. Quantizer 1 converts a multi-bit digital signal, e.g., a 24 bit digital signal, input with a sampling frequency fs to a 4 bit digital signal with 11 levels. Thermometer code converter 2 converts the output signal from quantizer 1 to a 12 bit thermometer code. For example, a quantized output of one level "0001" from quantizer 1 is converted to a thermometer code of "000000000001", and a quantized output of level two "0010" is converted to "000000000011". In FIG. 5, the circuit of the first embodiment of the present invention also includes frequency dividing circuit 3, three state counter 4, barrel shifter 5, and data latch 6. Frequency dividing circuit 3 carries out frequency division of a clock signal with a frequency 4*fs with a sub-multiple 4 to output a clock signal having a frequency fs. Three state counter 4 counts three values according to the clock signal having a frequency fs. Barrel shifter 5 carries out a shift in rotation depending on the state of the three state counter 4, in which the bit arrangement of the thermometer code is divided into P blocks, 3 blocks here, each of which is constituted of Q bits, 4 bits here. The blocks are shifted in rotation as P=1, 2, 3, 1, 2, 3, depending on the counted value of three state counter 4. For example, a thermometer code with an initial bit arrangement "000000000001" is output while being shifted in rotation depending on the counted value of the three state counter 4 as "000000010000", "000100000000", and then, "000000000001". Data latch 6 latches a code output from barrel shifter 5 in response to the clock signal having a frequency fs. Further, shift register 7 shifts a code output from data latch 6 bit by bit in each of the blocks in rotation in response to the clock signal having a frequency of 4*fs. Also, data latch 8 latches the code output from shift register 7 in response to the clock signal having a frequency of 4*fs. LDAC1 to LDAC12 are 1 bit local DACs each of which is equally weighted to another and corresponds to each bit of the code output from data latch 8 so as to be supplied with a specified unit amount when the corresponding bit is "1". Finally, analog adder 9 is connected to the local DACs LDAC1 to LDAC12 for carrying out an analog addition of the unit amounts supplied therefrom to produce an analog output.

Figure 6:
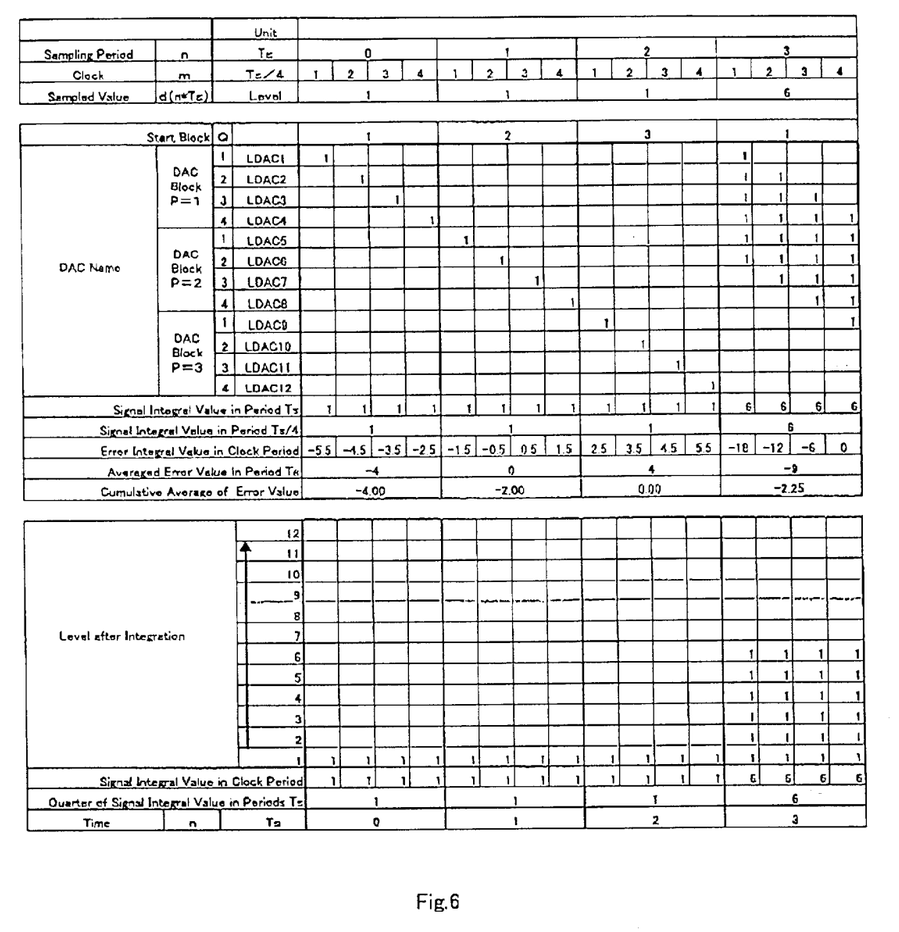
FIG. 6 is a diagram illustrating operation of the delta sigma digital-to-analog converter shown in FIG. 5.
Figure 7:
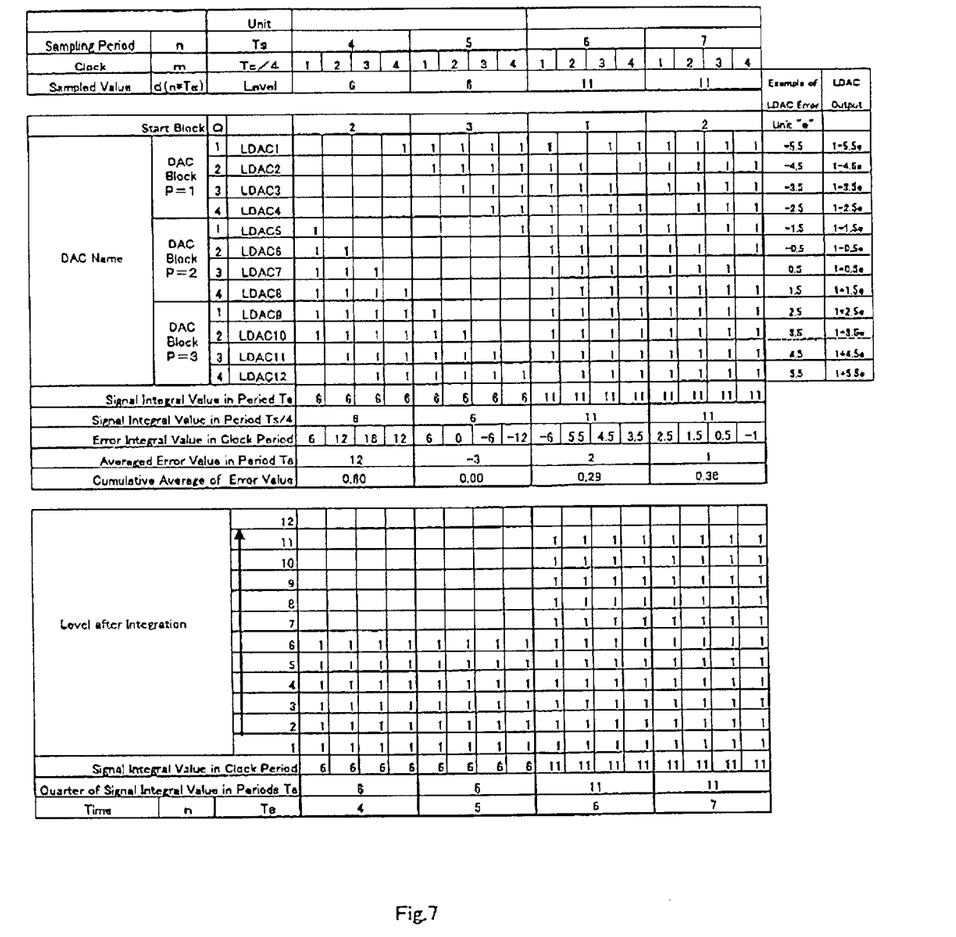
FIG. 7 is a diagram as a continuation of FIG. 6 illustrating operation of the delta sigma digital-to-analog converter shown in FIG. 5.

The operation of the first embodiment will be explained with reference to FIGS. 5, 6 and 7. In FIGS. 6 and 7, (note that FIG. 7 is a continuation of FIG. 6), the states are shown in every period Ts and in every period Ts/4 according to the sampling frequency fs. These states are shown for the unit amounts supplied to the LDAC1 to LDAC12, an integral value output from analog adder 9, an integral value and an averaged value of errors in the local DACs about a period, a cumulative average of errors in the local DACs, and an output level of analog adder 9.

First, a 4 bit digital signal X output from quantizer 1 is converted to a thermometer code by thermometer code converter 2. Barrel shifter 5 shifts each block P of 4 bits in the thermometer code in the order of P=1, 2, 3, 1, 2 ... at the sampling frequency fs. The shifting operation of barrel shifter 5 is carried out in response to the output of three state counter 3 operated at a frequency of fs. Data latch 6 holds the result of the shifting at barrel shifter 5. Shift register 7 shifts the output of data latch 6 at a frequency of 4*fs. The code output from shift resistor 7, which are taken as Y(P, Q), is supplied to each of LDAC1 to LDAC12, the outputs of which are then added to obtain the proper analog output.

Local DACs LDAC1 to IDAC12 are equally divided into three blocks such that the block of the LDAC1 to LDAC4 be taken as a first DAC block (P=1), that of the LDAC5 to LDAC8 be a second DAC block (P=2) and that of the LDAC9 to LDAC12 be a third DAC block (P=3). Shift register 7 shifts thermometer code 2 in rotation in local DACs LDAC1 to LDAC12 by 1 LDAC every period of Ts/4, to which the sampling period Ts is divided by sub-multiple 4. Along with this, the barrel shifter 5 shifts the thermometer code in rotation by one block every period of Ts to thereby shift the thermometer code in the DAC block every 1 Ts in rotation as P=1, 2, 3, 1, 2 .... This allows, as shown in FIG. 6 and FIG. 7, the thermometer code, even when it is of level 1, to be supplied to all of the LDACs in 3 periods Ts to reduce the number of sampling periods required for averaging. FIGS. 6 and 7 show the result of a simulation of the case in which the LDAC1 to IDAC12 have errors as shown in the upper right column in FIG. 7, which case is the same as that explained with reference to FIG. 3. It can be understood from the result of the simulation that the influence of errors due to a lower level code is reduced compared with the case of the conventional converter shown in FIG. 2, as demonstrated by the data in FIG. 3.

As explained above, the system according to the present invention can eliminate errors due to variations in the characteristics of the local DACs without setting the frequency of the system clock extremely high to thereby allow to improved performance without the problems of the prior art, which was previously carried out by either highly increasing the system clock frequency or highly increasing the number of levels.

Figure 8A:
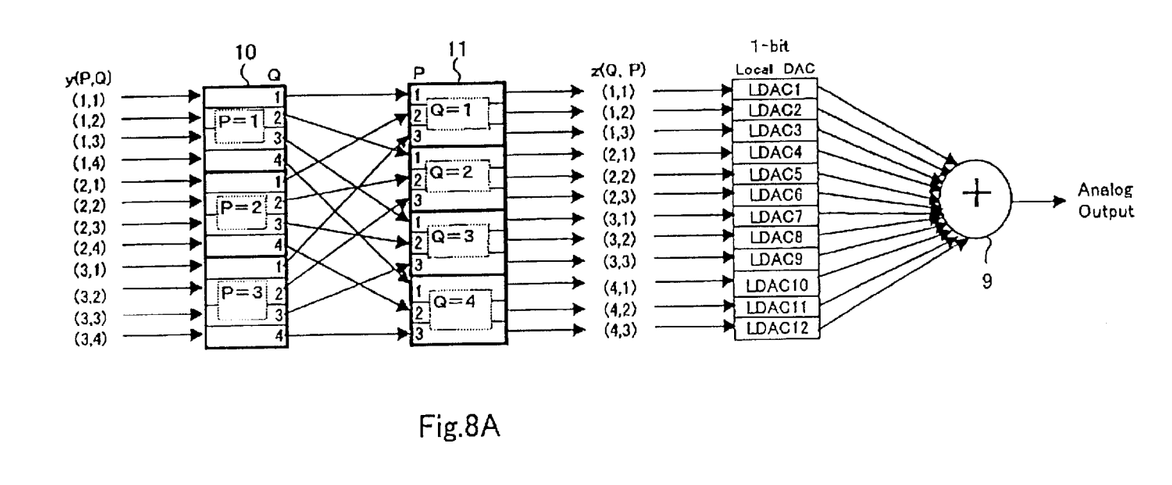
FIGS. 8A and 8B are a diagram illustrating a configuration of the second embodiment of the delta sigma digital-to-analog converter according to the present invention.

In a second embodiment of the present invention, shown in FIG. 8A, the bit arrangement of the thermometer code is taken as being divided into P blocks each including Q bits. The bit arrangement of the code is then taken as being expressed in terms of a matrix having P rows and Q columns in which the arrangement of the blocks is in rows and the arrangement of the bits in the blocks is in columns. The matrix is then transposed and the thus arranged code is then output to a plurality of the local DACs. The transposition between rows and columns results in allowing the unit amounts to be supplied to spatially scattered local DACs which reduces the distortions dependent on input data. In FIG. 8A, an arrangement of 12 bit code, which was supplied directly to the local DACs through thermometer code converter 2 and barrel shifter X3 in the prior art (FIG. 2), is taken as being expressed as y(P, Q) with the bit arrangement divided into P blocks (here for P=1 to 3) in order for every Q bits (here for Q=1 to 4). Data latch 10 receives the code y(P, Q) and outputs the code with the bit arrangement as received. Data latch 11 divides the bit arrangement of the input into Q blocks in order for every P bits. At the input (P=1) in the input block (Q=1), the output (Q=1) of the output block (P=2) of the data latch 10 is received, and at the input (P=3) in the input block (Q=1), the output (Q=1) of the output block (P=3) of the data latch 10 is received. In this way, at each of its inputs, data latch 11 receives the output of data latch 10 with the output block number and the bit number in the block of data latch 10 being interchanged with each other. Thus, the input code y(P, Q) in terms of a matrix having P rows and Q columns is output as a code z(Q, P) which comprises a transposed matrix with the rows and columns being interchanged between the input code y(P, Q) and output code z(Q, P). Each bits of the output code Z(Q,P) from data latch 11 is thereafter output to local DACs LDAC1 to LDAC12, and thereafter to analog adder 9, as in the first embodiment, to generate the appropriate analog output.

As described above, in the embodiment, a scattering in space is provided for the local DACs supplied with unit amounts to allow reduction of the input data dependent distortion in the output, which is due to change in shifting the data in rotation in the local DACs, which change occurs depending on bit levels of the output data in a form of the thermometer code.

Figure 8B:
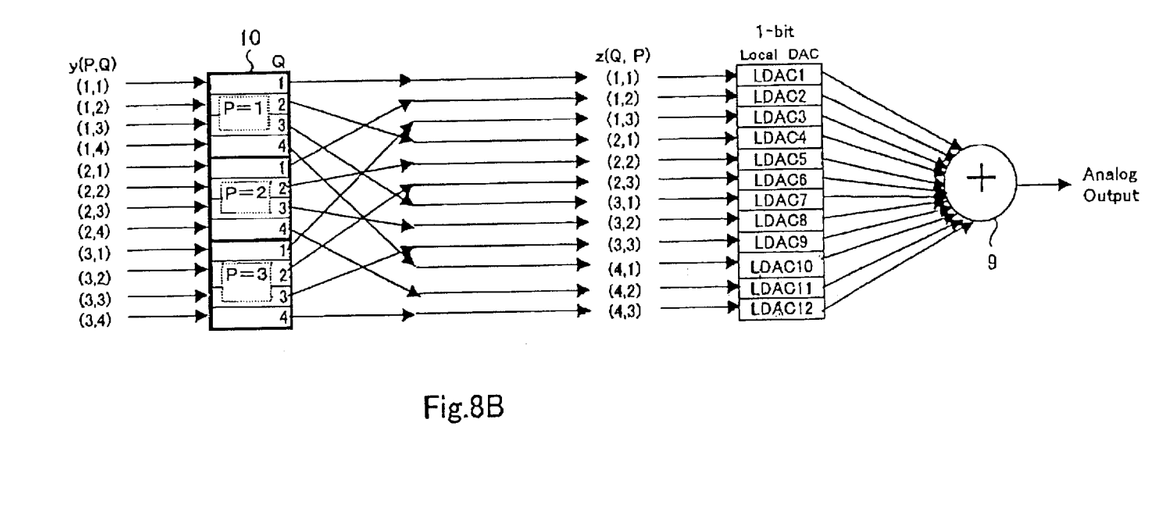

In addition, even when data latch 11 is omitted, and when data latch 10 is directly connected to local DACs LDAC1 to LDAC12, as shown in FIG. 8B, the same function and effect can be obtained as with respect to the circuit shown in FIG. 8A.

Figure 9:
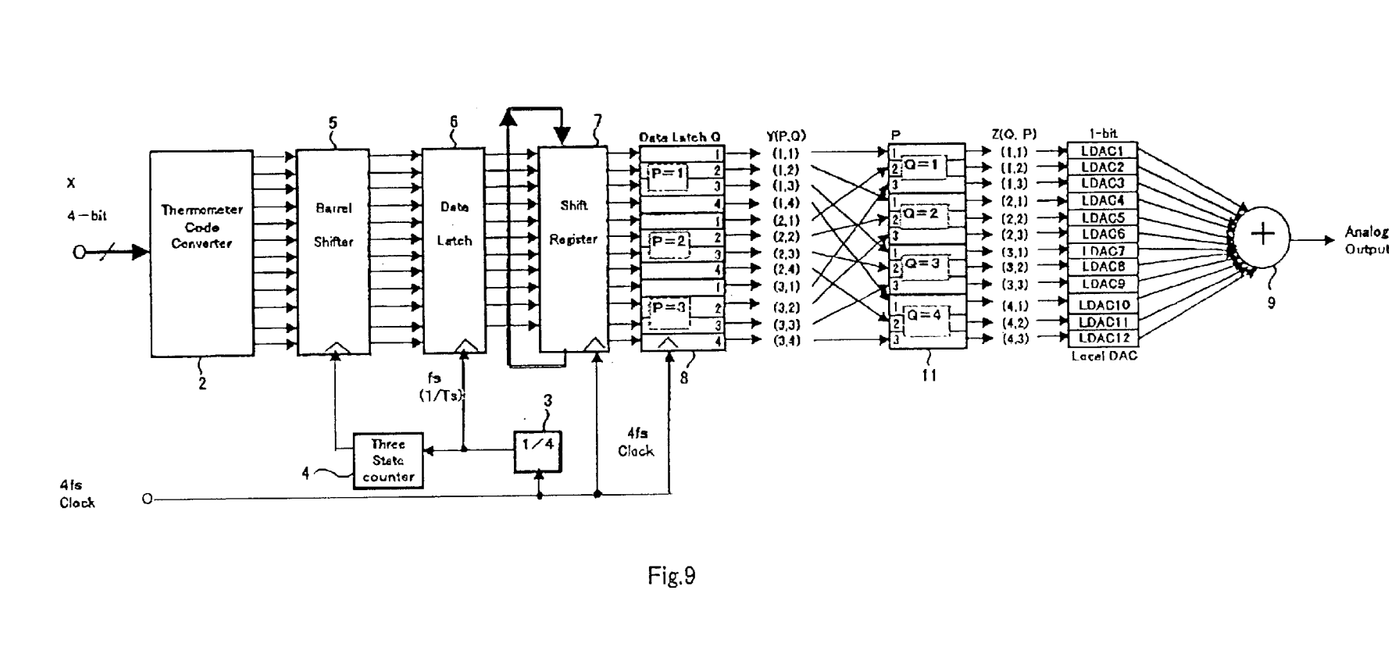
FIG. 9 is a diagram illustrating a configuration of a modification of the second embodiment of the delta sigma digital-to-analog converter according to the present invention.

The second embodiment shown in FIG. 8A may also be modified as shown in FIG. 9 so that code Y(P, Q), output from shift register 7 in terms of a matrix, is input to data latch 11 with the rows and columns being interchanged, in a manner similar to that shown in FIG. 8A where the data is transposed by the connections from data latch 10 to data latch 11 in the embodiment shown in FIG. 8A This configuration, as in the first embodiment, also provides a scattering in time for the local DACs supplied with unit amounts to further average variations among the local DACs for improving the distortion factor and the S/N ratio of the DAC.

In the delta sigma digital-to-analog converter of the present invention, two embodiments of an improved DAC configuration which equalizes the variation among multi-level local DACs both in time and in space without increasing the noise shaper frequency fs more than necessary. This allows the realization of the lower distortion and the higher S/N ratio required for modem high performance audio equipment.

While the invention has been particularly shown and described with reference to preferred embodiments thereof, it will be understood by those skilled in the art that the foregoing and other changes in form and details can be made therein without departing from the spirit and scope of the invention.

We claim:

1. A delta sigma digital-to-analog converter comprising:

set of N one bit local digital to analog converters equally weighted to each other, where N is equal to P times Q and where P and Q are each predetermined integers having a value of at least two;

a quantizer having a digital input and an output having P times Q minus one quantized levels at a predetermined sampling frequency fs;

a first converter having an input connected to said output of said quantizer for converting said quantizer output to a thermometer code comprising P times Q bits, which thermometer code is provided as an output of said first converter; and a second converter connected to said output of said first converter for receiving said thermometer code, dividing a bit arrangement of said thermometer code into P blocks, each being taken as one block for every Q bits, shifting the bit arrangement in unit of the block in rotation at the sampling frequency fs, further shifting the bit arrangement in unit of the bit in rotation at the sampling frequency fs times Q, and thereby producing an output code on an output of said second converter, which output is, in turn, connected to said local digital to analog converters in corresponding order.

2. A delta sigma digital-to-analog converter comprising:

a set of N one bit local digital to analog converters equally weighted to each other, where N is equal to P times Q and where P and Q are each predetermined integers having a value of at least two;

a quantizer having a digital input and an output having P times Q minus one quantized levels at a predetermined sampling frequency fs;

a first converter having an input connected to said output of said quantizer for converting said quantizer output to a thermometer code comprising P times Q bits, which thermometer code is provided on an output of said first converter; and a second converter receiving said thermometer code, dividing a bit arrangement of said thermometer code into P blocks each being taken as one block for every Q bits, converting said bit arrangement of said thermometer code, which arrangement is a matrix having P rows and Q columns where P represents the number of the blocks and Q represents the number of bits in each block, to a code output expressed in terms of a matrix having Q rows and P columns by interchanging the rows and columns, and supplying said code output, expressed in terms of a matrix having Q rows and P columns, as an output of said second converter, which output is connected to said local digital to analog converters in corresponding order.

* * * * *